United States Patent
Beffa

[19]

[11] Patent Number: 5,965,902
[45] Date of Patent: *Oct. 12, 1999

[54] METHOD AND APPARATUS FOR TESTING OF DIELECTRIC DEFECTS IN A PACKAGED SEMICONDUCTOR MEMORY DEVICE

[75] Inventor: Ray Beffa, Boise, Id.

[73] Assignee: Micron Technology, Boise, Id.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/531,212

[22] Filed: Sep. 19, 1995

[51] Int. Cl.$^6$ ............................ H01L 27/10; G11C 7/02
[52] U.S. Cl. .......................... 257/48; 257/203; 257/208; 365/201
[58] Field of Search ............................ 257/48, 206, 208, 257/905, 906; 365/200, 201

[56] References Cited

U.S. PATENT DOCUMENTS

| | | | |
|---|---|---|---|
| 4,573,146 | 2/1986 | Graham et al. | 365/200 |
| 4,595,875 | 6/1986 | Chan et al. | 324/73 PC |
| 4,769,784 | 9/1988 | Doluca et al. | 365/149 |
| 5,110,754 | 5/1992 | Lowrey et al. | 437/52 |
| 5,212,442 | 5/1993 | O'Toole et al. | 324/158 R |
| 5,241,496 | 8/1993 | Lowrey et al. | 365/96 |
| 5,257,229 | 10/1993 | McClure et al. | 365/200 |
| 5,291,454 | 3/1994 | Yamasaki et al. | 365/226 |
| 5,291,455 | 3/1994 | Feng et al. | 365/226 |
| 5,297,099 | 3/1994 | Bolan et al. | 365/229 |
| 5,307,318 | 4/1994 | Nemoto | 365/226 |
| 5,317,532 | 5/1994 | Ochii | 365/149 |
| 5,355,340 | 10/1994 | Coker et al. | 365/200 |
| 5,381,373 | 1/1995 | Ohsawa | 365/201 |
| 5,434,438 | 7/1995 | Kuo | 257/300 |
| 5,466,888 | 11/1995 | Beng et al. | 174/52.2 |
| 5,467,356 | 11/1995 | Choi | 371/21.1 |
| 5,473,198 | 12/1995 | Hagiya et al. | 257/786 |
| 5,511,029 | 4/1996 | Sawada et al. | 365/201 |
| 5,535,161 | 7/1996 | Kato | 365/200 |
| 5,544,106 | 8/1996 | Koike | 365/200 |
| 5,559,741 | 9/1996 | Sobue | 365/200 |
| 5,563,832 | 10/1996 | Kagami | 365/200 |
| 5,590,075 | 12/1996 | Mazzali | 365/185.22 |
| 5,608,337 | 3/1997 | Hendricks et al. | 324/765 |
| 5,619,462 | 4/1997 | McClure | 365/201 |
| 5,627,478 | 5/1997 | Habersetzer et al. | 324/763 |
| 5,648,730 | 7/1997 | Bhuva et al. | 324/763 |
| 5,652,725 | 7/1997 | Suma et al. | 365/200 |
| 5,657,284 | 8/1997 | Beffa | 365/201 |
| 5,777,932 | 7/1998 | Chonan | 365/201 |

FOREIGN PATENT DOCUMENTS

| | | |
|---|---|---|
| 1-100788 | 4/1989 | Japan . |
| 6-150697 | 5/1994 | Japan . |

*Primary Examiner*—Olik Chaudhuri
*Assistant Examiner*—Howard Weiss
*Attorney, Agent, or Firm*—Seed and Berry LLP

[57] ABSTRACT

A semiconductor memory device includes a die having a semiconductor memory circuit formed thereon and a plurality of pads at the periphery of the die that are electrically coupled to the circuit. Electrically conductive leads have a pin end for external coupling, and a free end electrically connected by bond wires to certain pads on the die. An encapsulating material such as epoxy encapsulates the die, bond wires and free ends of the leads to form a packaged chip. A superfluous lead such as an address lead unused during testing, redundant voltage supply lead or non-connected lead is coupled, by means of a bond wire, to a pad that, in turn, is coupled through a switching transistor to a common cell plate or DVC2 node for all storage capacitors in the memory circuit. External power can thereby be provided to the DVC2 node to simultaneously apply a high voltage to this node of all capacitors during stress testing of the chip. The arrangement allows for efficient testing for dielectric defects in the capacitors while the die is in packaged chip form.

16 Claims, 6 Drawing Sheets

METHOD AND APPARATUS FOR TESTING OF DIELECTRIC DEFECTS IN A PACKAGED SEMICONDUCTOR MEMORY DEVICE

TECHNICAL FIELD

The present invention relates to apparatus and methods for testing semiconductor electrical devices, particularly memory devices.

BACKGROUND OF THE INVENTION

Various types of defects and failures can occur during the manufacture of semiconductor devices. A "failure" occurs when a semiconductor device fails to meet its specifications. A "defect" occurs when a semiconductor device has an improper circuit structure that currently presents a failure of the device, or has the potential to fail during the expected lifetime of the device. For example, due to a manufacturing error, an insulator or dielectric such as nitrite between electrodes in a capacitor can be thinned or include pin holes which could currently provide a short or decreased capacitance therebetween, or could break down over a period of time ("a dielectric defect"). After this period of time, typically during prolonged use of the device, the thinned or apertured dielectric provides a conductive path between the electrodes so that a "high" voltage stored on one electrode forces a "low" voltage on the adjacent electrode to rise to a high value, resulting in a failure of the device.

Therefore, an aperture between electrodes that presently reduces the capacitor's ability to hold a charge is a defect resulting in a failure of the semiconductor device. An apertured or thinned dielectric that has not yet formed a sufficient short between the two electrodes, however, is a defect that has not yet evidenced itself as a failure. As a result, the semiconductor device can be operated for a brief time under standard operating conditions and voltages before the defect manifests itself as a failure.

Testing is performed on semiconductor devices to locate defects and failures in such devices. As circuit density on semiconductor devices increases, the number of defects and failures can increase. Semiconductor manufacturers, therefore, have an increasing need to detect for defects and failures in semiconductor devices as circuit density on these devices increases.

Thus, for quality control and to improve yields of acceptably operable semiconductor devices, semiconductor devices are tested, often before a die containing the semiconductor device is packaged into a chip. A series of probes on a test station electrically contact pads on each die in a wafer to thereby access portions of the individual semiconductor devices on the die. For example, in a semiconductor memory device, the probes contact address and data input/output pads to access selected memory cells in the memory device. Typical dynamic random access memory devices ("DRAM") include one or more arrays of memory cells that are each arranged in rows and columns. Each array of memory cells includes word or row lines that select memory cells along a selected row, and bit, digit or column lines (or pairs of lines) that select individual memory cells along a row to read data from, or write data to, the cells in the selected row.

During testing, predetermined data or voltage values are typically written to selected row addresses, or row and column addresses, that correspond to certain memory cells, and then the voltage values are read from those memory cells to determine if the read data matches the data written to those addresses. If the read data does not match the written data, then the memory cells at the selected addresses likely contain defects and the semiconductor devices fail the test.

A person testing the several dies on the wafer can then examine a particular die itself, by means of a microscope, to determine if failures occurred from masking defects, during the deposition of certain layers, and so forth. During the initial development of a semiconductor device, and while the device is in die form, changes to masks can be made to compensate for most detected failures. However, once a semiconductor device is in production and packaged as a chip, redundant circuitry on the semiconductor device can be employed to compensate for only certain detected failures. Redundant circuitry on the semiconductor device cannot compensate for many detected failures, and therefore, such failed devices must generally be discarded.

To increase output of acceptable semiconductor devices, semiconductor manufacturers strive to perform rapid testing of the semiconductor devices to expose defects in the devices before shipping them to a vendor or user. A semiconductor device can be most thoroughly tested when the device is still in die form on the semiconductor wafer. Semiconductor wafers, however, are often difficult to manipulate, and typically require a test bed or other apparatus to releasably secure the wafer while the probes are adjusted to contact the pads on each die on the wafer. As a result, testing of semiconductor devices in die form is time consuming. Therefore, semiconductor manufacturers desire to test a given semiconductor device after it has been packaged as a semiconductor chip, because the chip can be automatically inserted into a test socket for testing using pick and place machinery. Automated testing circuitry can then apply predetermined voltages and signals to the chip, write test patterns thereto, and analyze the results therefrom to detect for failures in the chip.

Often, the number of pads on a die is greater than the number of pins on the packaged semiconductor chip. Therefore, as noted above, certain tests performed while the semiconductor device is in die form cannot be performed on the device after it has been packaged. As a result, package chips necessarily undergo less rigorous testing than unpackaged dies. Packaged chips can include manufacturing defects that are not yet failures and thus are undetectable by the limited number of tests capable of being performed on the packaged chips.

For example, in typical semiconductor memory devices, such as DRAMs, the capacitor in each memory cell has a "storage electrode" that stores a voltage value representing the data written to the memory cell (a high voltage value indicating a logical "1" value and a low voltage value indicating a logical "0" value). "Ground" electrodes for each of the capacitors are typically electrically intercoupled at a "DVC2 node" as a single conductive layer in the semiconductor device to form a "cell plate." The DVC2 node is typically maintained at a voltage value approximately half that of the positive supply voltage or Vcc/2 to thereby provide a maximum voltage differential between the storage and cell plates of each capacitor, regardless of whether a high or low voltage is written to the storage plate.

To test for the dielectric defect discussed above, a test circuit writes low voltage values (as logical "0" values) to all capacitors in the memory cells of the memory cell array. The test circuit thereafter raises the voltage at the DVC2 node to a voltage value approximately equal to Vcc. The test circuit then determines whether all the memory cells have maintained a logical "0" value. If not, then the "high" voltage value applied to the DVC2 node has leaked or shorted to the storage plate of a capacitor in a memory cell, causing the low voltage or logical "0" value initially stored thereon to rise and become a high voltage or logical "1" value.

The time required for the high voltage value on the DVC2 node to raise the voltage on the storage plate of a capacitor will vary depending upon the severity of the defect in the dielectric between the cell and storage plates. As a result, a high voltage value over a continuous period of time must be applied to the DVC2 node to force the failure in one or more of the memory cells in the semiconductor device. External test circuitry typically must apply such a continuous, high voltage value to the semiconductor memory device while the device is still in its die form.

Many semiconductor memory devices include an on-chip voltage pump that provides the Vcc/2 voltage to the DVC2 node. The on-chip voltage pump, however, typically does not have the capacity to raise the voltage of the DVC2 node well beyond the Vcc/2 value for a prolonged period of time. Consequently, dielectric defects cannot be efficiently tested in packaged chips. As a result, dielectric defects can typically only be tested efficiently when the semiconductor memory device is in die form. Probes access the DVC2 node and apply supplemental power to the device being tested to thereby provide the high voltage value to the cell plate over the continuous test period. Such a dielectric stress test, however, suffers from the above-described difficulties in testing semiconductor memory circuits when in die form. Therefore, while such a test is desirable, its value is offset by the time consuming process of manipulating and testing semiconductor wafers.

SUMMARY OF THE INVENTION

The present invention allows packaged semiconductor chips, such as DRAMs and other semiconductor memory devices, to undergo certain tests when in packaged form, where such tests previously had been available only to unpackaged devices (i.e., semiconductor devices in die form). The present invention electrically couples a pin or lead on the packaged chip, which is superfluous during testing of the chip, to a DVC2 node pad on the die. An enable signal applied to several of the remaining pins causes a normally open switch (e.g., a transistor) to conduct and allow power from an external supply to be applied to the DVC2 node on the die while in packaged chip form, to thereby efficiently perform certain tests on the semiconductor device. For example, a voltage pump circuit on the die provides a voltage of only Vcc/2 to the DVC2 node. By switching off the voltage pump and coupling the external power supply to the DVC2 node through a redundant address pin in the packaged part, a greater voltage can be applied to DVC2 node, to thereby simultaneously stress test all memory cells in the semiconductor memory device. Alternatively, an unused or non-connected pin can be so coupled. As a result, the present invention allows one of the most common defects in DRAMs, dielectric defects, to be rapidly tested in a packaged chip. Since packaged chips can be tested in parallel, using automated equipment, as opposed to testing in die form, the present invention provides a tremendous time saving step during the testing of semiconductor devices.

In a broad sense, the present invention embodies a semiconductor device capable of receiving external power. The semiconductor device includes a semiconductor circuit having a plurality of circuit cells addressable by electrically conductive row and column lines. Each circuit cell includes a capacitor having first and second electrodes. The second electrode of at least some of the plurality of circuit cells are electrically intercoupled at a common node.

A die having the semiconductor circuit and a plurality of input terminals formed thereon has a first input terminal that is electrically coupled to the common node. A first set of input terminals is coupled to and provides power signals to the semiconductor circuit. A second set of input terminals is coupled to and provides address signals to access circuit cells in the semiconductor circuit through the row and column lines. A third set of input terminals is coupled to and provides input signals to and output signals from the semiconductor circuit.

A plurality of electrically conductive leads includes first, second and third sets of leads. Each lead has a pin end and a free end. The free ends of first, second and third sets of leads are electrically coupled to at least some of the input terminals in the first, second and third sets of input terminals, respectively. At least one of the plurality of leads is a superfluous lead. An electrical conductor is coupled between the first input terminal and the free end of the superfluous lead. This superfluous lead is capable of providing external power to the common node through the electrical conductor and the first input terminal. An encapsulated material encapsulates the semiconductor circuit, the die, the free ends of leads and the electrical conductor as a packaged chip.

The present invention also embodies a method of forming a semiconductor device comprising the steps of: (i) providing a die; (ii) forming a semiconductor memory circuit on the die, the semiconductor memory circuit including an array of memory cells accessible by a plurality of row and column lines, each circuit cell including a capacitor having first and second electrodes; (iii) forming a common node electrically coupled to the second electrode of at least some of the capacitors in the plurality of memory cells; (iv) forming a plurality of pads on the die, a first pad being electrically coupled to the common node, a first set of pads being coupled to and providing power signals to the semiconductor memory circuit, a second set of pads being coupled to and providing address signals to access memory cells in the semiconductor memory circuit through the row and column lines, and a third set of pads being coupled to and providing input signals to and output signals from the semiconductor memory circuit; (v) providing a plurality of electrically conductive leads including a superfluous lead, each lead having a pin end for external electrical coupling; (vi) electrically connecting free ends of first, second and third sets of leads to at least some of the pads in the first, second and third sets of pads, respectively; (vii) electrically connecting a free end of the superfluous lead to the first pad to thereby allow external power to be provided to the plurality of memory cells through the common node; and, (viii) encapsulating the die, the semiconductor memory circuit, the common node, and the free ends of the leads as an externally testable packaged device.

The present invention furthermore embodies a method of testing a packaged semiconductor device having a semiconductor memory circuit, and a plurality of pads formed on a die. The memory circuit has an array of memory cells addressable by electrically conductive row and column lines. Each memory cell includes a capacitor having first and second electrodes. The second electrode of at least some of the plurality of capacitors are electrically intercoupled at a common node. A first set of pads is coupled and provides power signals to the semiconductor memory circuit, a second set of pads is coupled to and provides address signals to access memory cells in the semiconductor memory circuit through the row and column lines, and a third set of pads is coupled to and provides input signals to and output signals from the semiconductor memory circuit. The semiconductor device also has a plurality of electrically conductive leads each having a pin end and a free end. The free ends of first, second and third sets of leads are electrically connected to at least some of the pads in the first, second and third sets of pads, respectively. The method includes the steps of: (i) providing the packaged semiconductor memory device, the memory device having at least one superfluous lead having a free end coupled to the first pad; (ii) applying a predetermined voltage to at least one of the plurality of leads; (iii) applying a predetermined combination of signals to the leads in the first or second sets of leads; (iv) storing a low voltage value on the memory cells; (v) providing external power to the superfluous lead as a high voltage signal; (vi) simultaneously applying the external power for a predetermined period of time to the common node and thereby writing a high voltage value to the second electrode in the plurality of memory cells; (vii) analyzing values stored in the memory cells; and (viii) determining that the memory device is defective if any of the memory cells contain a high voltage value stored thereto.

The present invention solves problems inherent in the prior art of semiconductor testing by allowing certain tests to be performed on packaged semiconductor chips that are available to unpackaged dies, but previously unavailable to packaged chips. As a result, the present invention can rapidly test semiconductor devices for dielectric defects by supplying a high external voltage to be applied to the DVC2 node in a packaged part to allow all memory cells in a memory device to be simultaneously stress tested for dielectric flaws in storage capacitors. Other features and advantages of the present invention will become apparent from studying the following detailed description of the presently preferred embodiment, together with the following drawings.

DETAILED DESCRIPTION OF THE INVENTION

Figure 1:
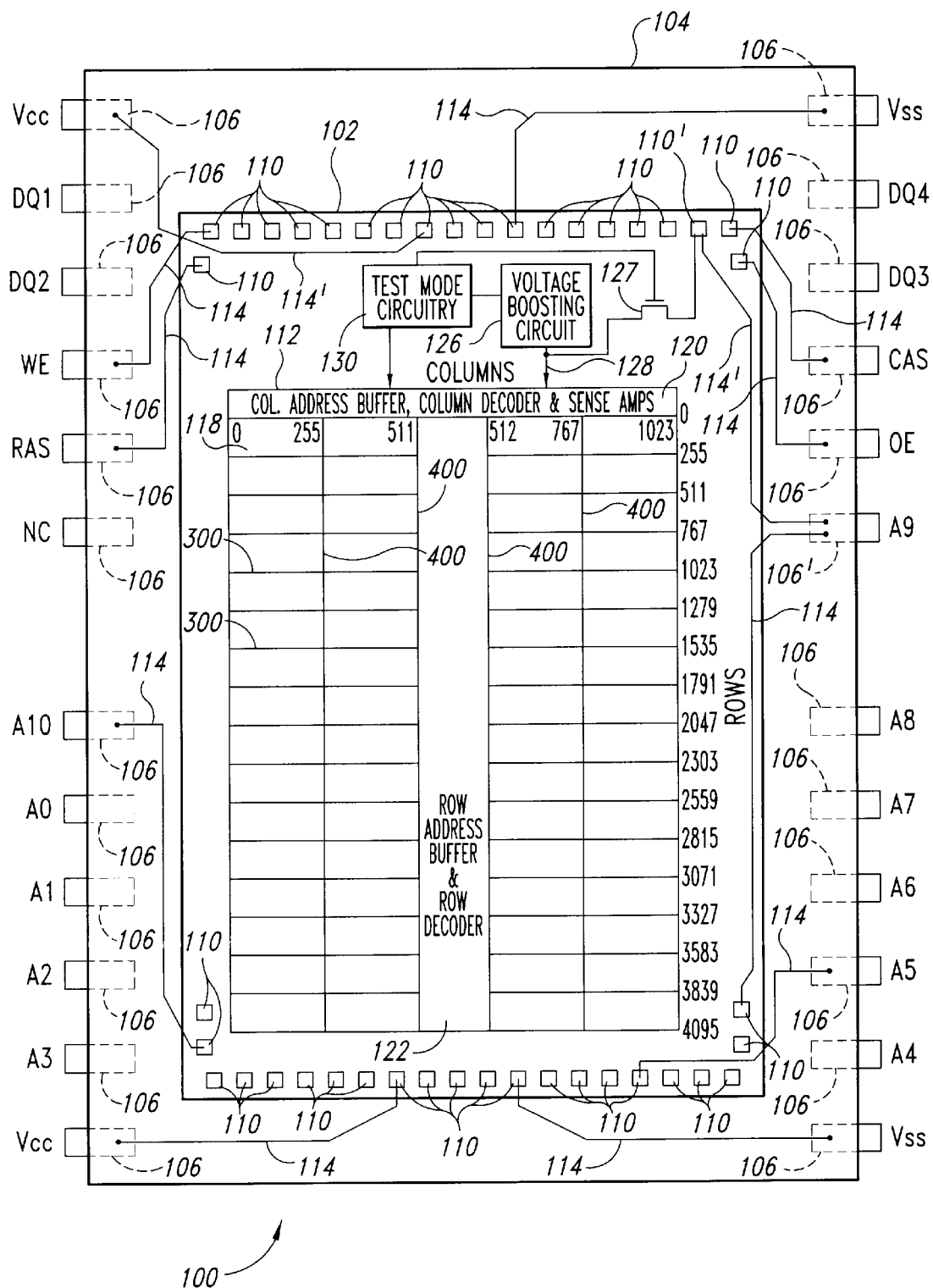
FIG. 1 is a combination block diagram and plan view of a preferred embodiment of a packaged semiconductor memory according to the present invention.

Referring to FIG. 1, a 16 megabit DRAM packaged chip 100 includes a substrate or die 102 encapsulated by a protective material 104 such as epoxy or plastic. Twenty-four electrically conductive leads 106 have a pin end extending from the packaged chip 100, and a free end (shown in dashed lines) encapsulated within the protective material 104. As used generally herein, the terms "leads" and "pins" are used interchangeably. Several pads 110 are formed on the periphery of the die 102. The pads 110 are electrically coupled to a semiconductor circuit, such as a memory circuit 112, formed on the die 102 and form input terminals for the circuit. As explained more fully below, several of the pads 110 are electrically coupled to the free ends of the leads 106 by means of electrically conductive members, such as bond wires 114. As a result, the pin ends of the leads 106 in the packaged chip 100 provide an external electrical path through the bond wire 114 to the die 102.

Each of the twenty-four leads 106 in the packaged chip 100 typically has an industry specified standard assignment based on the type of semiconductor circuit formed on the die 102. An acronym for the assignment of each pin in the exemplary 16 megabit circuit is shown next to the pin end of the leads, and are as follows: positive voltage supply pins Vcc, data input/output pins DQ1–DQ4, address pins A0–A10, write enable pin WE, row address strobe pin RAS, column address strobe pin CAS, output enable pin OE, negative or ground voltage supply pins Vss, and a non-connected pin NC. While the general type of signals applied to each pin are established by industry standards, the particular voltages and timing of the signals applied to each pin often vary between packaged chips 100, and between manufacturers of similar semiconductor circuits.

Several pads 110 shown in FIG. 1 have acronyms that are identical to the pin assignment acronyms for the twenty-four leads 106. The free end of each lead 106 is electrically coupled to its appropriate pad 110 by means of bond wires 114. For example, the lead 106 associated with the A10 pin is coupled to the A10 pad 110 by means of the bond wire 114, while the leads associated with the Vss pins are similarly coupled to Vss pads. Unlabeled pads generally indicate pads accessible by probes during testing of the die 102 prior to being packaged as the packaged chip 100, but which are not connected to any leads 106.

External signals are applied to the semiconductor memory circuit 112 by means of the pin ends of the leads 106. Therefore, the address pins A0 through A9 receive address signals to access particular memory cells in the memory circuit 112. An external power supply provides the positive supply voltage Vcc to the packaged chip 100 by means of one or both of the Vcc pins, while a negative or ground supply voltage Vss is applied to one or both of the Vss pins. Specified input and output signals are exchanged by means of the WE, RAS, CAS, OE, and DQ1–DQ4 pins.

The memory circuit 112 includes arrays of memory cells 118 that are accessed by digit or column lines 400 and word or row lines 300. For a 16 megabit memory array, the memory circuit 112 preferably includes 1,024 column lines 400 and 4,096 row lines 300 for each of four memory cell arrays. As is known in the art, individual memory cells in each memory cell array 118 are addressed by activating one of the row lines 0 through 4,095, and then activating the appropriate column lines 0 through 1,023.

Data is written to, and read from, memory cells in the memory cell arrays 118 by means of column circuitry 120, and row circuitry 122. The column circuitry 120 includes a column address buffer, a column decoder and sense amplifiers, while the row circuitry 122 includes a row address buffer and a row decoder. The column and row circuitry 120 and 122 also includes refresh controllers and counters, clock generators, data in/out buffers, and other circuitry known in the semiconductor memory art.

As shown in FIG. 1, the packaged chip 100 has eleven address pins having assignments A0 through A10. To access the rows of memory cells in all of the four memory cell arrays 118, all eleven address pins are required. However, during a testing mode for the packaged chip 100 (described below), address values are compressed or multiplexed to allow similar data to be written to multiple address locations in the memory arrays 118. By compressing address values and accessing, e.g., two row lines 300 simultaneously, fewer addresses are required. As a result, only ten of the eleven address pins are required to access all of the rows 300. With such an arrangement, one of the eleven address pins is freed up and can be used for inputting an additional signal.

As a result of compression mode testing, a lead 106', forming one of the address pins (e.g., the A9 pin), has a free end electrically coupled to a DVC2 pad 110' by means of a bond wire 114'. The DVC2 pad 110' is electrically coupled, through a switch such as a transistor 127, to a DVC2 bus 128. The lead 106' is also coupled to the A9 pad 110. The switching transistor 127 is normally open, and therefore, external signals applied to the lead 106' are directed to the A9 pad. However, when the switching transistor 127 is closed, it reroutes signals applied to the lead 106' through the DVC2 pad 110' and to the DVC2 bus 128, while the lead 106' is disconnected from the A9 pad 110 (by means such as another switching transistor, not shown).

A voltage boosting circuit 126 coupled to the DVC2 bus 128 generates the above-described Vcc/2 voltage and applies the voltage to the DVC2 node. For example, if Vcc is equal to 3 volts, then Vcc/2 equals 1.5 volts. While the high voltage supplied by the external power supply 176 is preferably applied to the DVC2 node directly from the DVC2 pad 110' to the DVC2 bus 128, the external voltage can be routed through the voltage boosting circuit 126 and then to the DVC2 bus.

The voltage boosting circuit 126 only supplies a voltage equal to Vcc/2 to the DVC2 bus. Under a testing mode of operation, an external power supply 176 (shown in FIG. 4) is coupled to the lead 106' and external power is provided through the bond wire 114' to the DVC2 node to raise the voltage on this node well above Vcc/2, to a value closer to Vcc in order to stress dielectric defects into faults. Therefore, if Vcc is equal to 3 volts, then the external power applied to the lead 106' is about 2.5V to 3.0V.

Test mode circuitry 130 formed on the die 102 is coupled to the memory circuit 112, the voltage boosting circuit 126, and the transistor 127 to enable the external power to be provided to the DVC2 bus 128. The test mode circuitry 130 allows the voltage boosting circuit 126 to be switched off and the memory circuit 112 to be tested under several test routines when a predetermined series of steps are initially performed on the packaged chip 100, as described more thoroughly below. As noted above, the DVC2 node forms a ground electrode or cell plate that is common to all storage capacitors in the memory array 118. As a result, the present invention can simultaneously stress test all storage capacitors in the memory cell arrays 118.

Figure 2A:
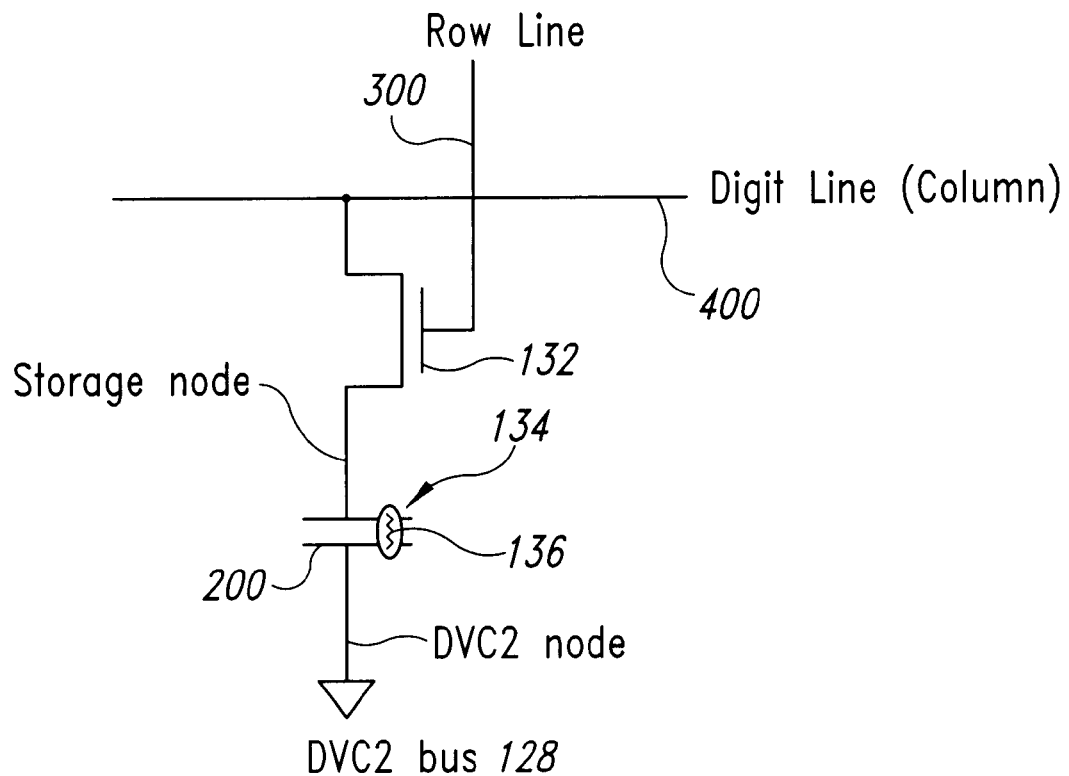
FIG. 2A is a schematic diagram of a memory cell from the semiconductor memory device of FIG. 1, which shows a defect short circuiting the two electrodes of a storage capacitor in the memory cell.

Referring to FIG. 2A, a memory cell from the memory cell array 118 is shown. The memory cell includes a transistor 132 that accesses the storage node or plate of a capacitor 200 that stores a high or low voltage value (i.e., a logical "1" or "0" value). A row line 300 is coupled to the gate of the transistor 132, while a column line 400 is coupled to the collector of the transistor. Depending upon the configuration of the memory circuit 112, if four memory cell arrays 118 are employed, then a single column address would access four capacitors 200 by means of four row or column lines. To simplify the discussion herein, however, only a single memory cell array 118 is described in detail.

During fabrication of the memory cell array 118, a defect 134 can occur between the two electrodes or plates of the capacitor 200, which provides a resistive short circuit between the plates of the capacitor. Therefore, the defect 134 is shown as a resistor 136 coupled between the plates of the capacitors 200 in FIG. 2A. The defect 134 can be caused by an aperture formed in the nitrite dielectric between the plates of the capacitor 200 during fabrication of the memory cell array 118.

Figure 2B:
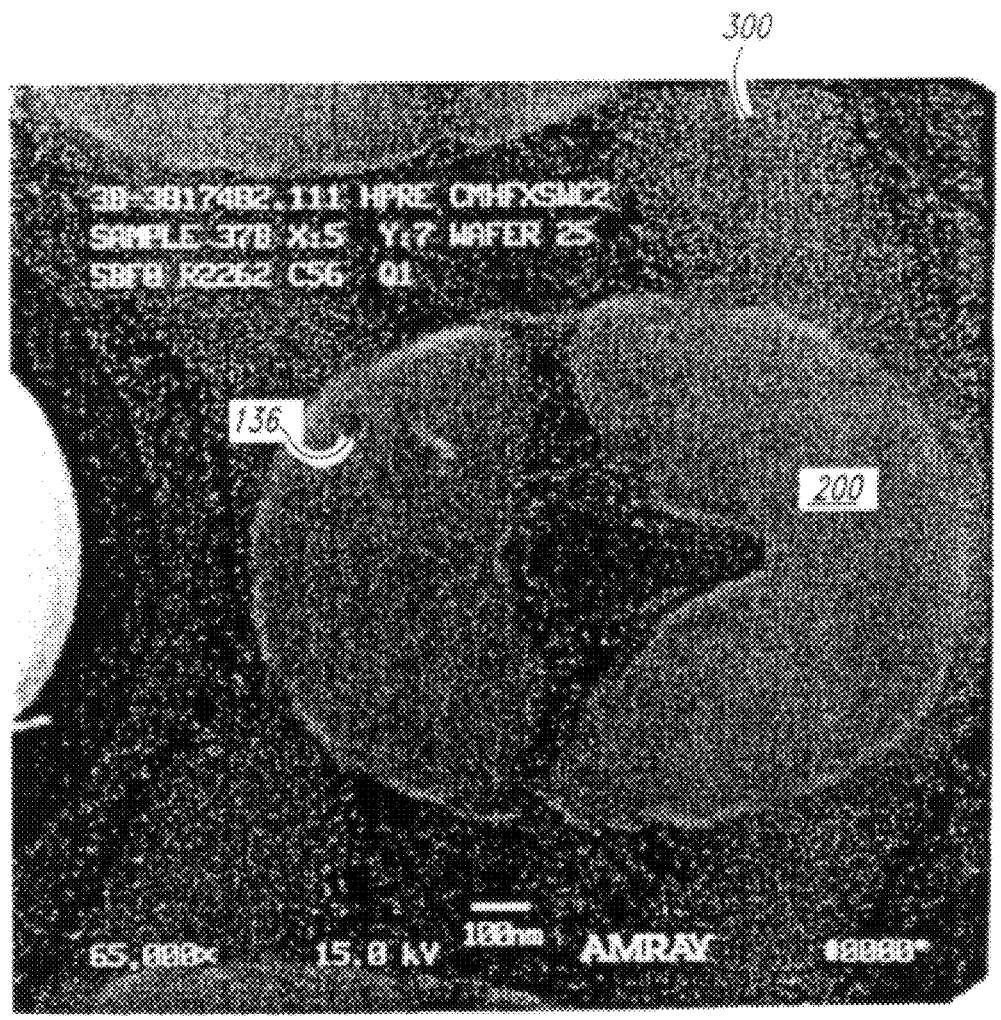
FIG. 2B is a scanning electron microscope photograph of a memory cell from the semiconductor memory device of FIG. 1 showing a defect in the dielectric of a storage capacitor in the memory cell.

The scanning electron microscope photograph of FIG. 2B shows such a defect. The photograph of FIG. 2B shows a greatly enlarged electrode and dielectric of the capacitor 200 (shown as a large oval). The row line 300, shown as a wide, vertical grey band, is electrically coupled to the capacitor 200. An aperture or pin hole forming the defect 134 is shown as a small black dot in the nitrite dielectric deposited between the plates of the capacitor 200. The nitrite defect 134 between the plates of the capacitor 200 provides an electrically conductive path between the plates resulting in the above-described dielectric defect. As a result, if a high voltage value is applied to the DVC2 node for the capacitor 200, while a low voltage or logical "0" value is written to the storage node or plate for the capacitor, the high voltage value on the DVC2 node will be forced onto the storage plate over a period of time to become a logical "1" value.

In a test mode of operation, the present invention preferably writes low voltage values to storage plates of all of the memory cells in the memory cell array 118. Thereafter, the voltage on the DVC2 node is raised to a high voltage value (i.e., greater than Vcc/2, or approximately equal to Vcc). The high voltage value at the DVC2 node is maintained for a sufficient period of time to stress a defect through the dielectric between the plates of the capacitors into becoming a failure. In other words, the high voltage value is maintained until the high value on the common cell plate for all capacitors is forced through apertures or other defects 134 in the dielectrics onto the storage plates of one or more capacitors. The values on all of the storage plates of the capacitors are then read, and if any have a logical "1" value, then one or more defects 134 are located.

Figure 3:
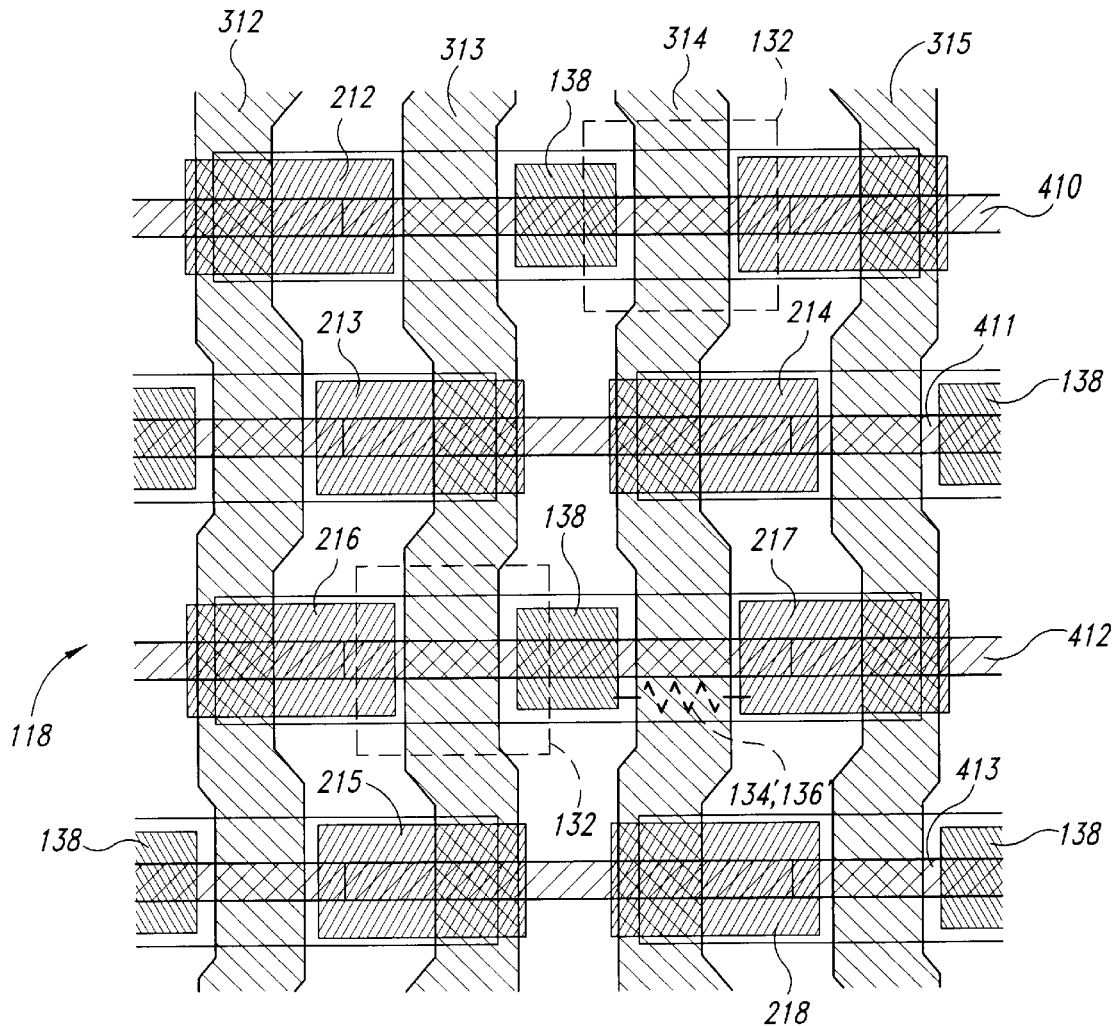
FIG. 3 is a greatly enlarged plan view of memory cells for the semiconductor memory circuit of FIG. 1 showing the physical layout of the memory cells.

The present invention also provides a method of testing for short circuit defects or resistive shorts between the capacitor 200 and the column line 400. Referring to FIG. 3, a preferred layout for the memory cell array 118 is shown as having row lines 312–315 and column lines 410–413. Column contacts 138 extend from an upper surface of the die 102 upward to the column lines 410–413, thereby electrically coupling the column lines with the die (which forms the substrate for the memory cell array 118). Since the column contacts 138 extend through many layers in the memory cell array 118, they could short to the common cell plate layer (i.e. DVC2 node), which is a layer underlying the layer containing the column lines. Thus, a defect 134' can form a resistive short 136' (shown in dashed lines) between a capacitor 217 and the column line 412 at a location proximate to the column contact 138.

By applying a high voltage to the DVC2 node, which is essentially the common cell plate for capacitors 212–218 in FIG. 3, high voltage can be applied to the column line 412 through the resistive short 136'. Consequently, the "0"

logical value written to the capacitor 217 is read as a logical "1" value because of the defect 134'. More importantly, the high voltage applied to the DVC2 node is directly applied to the column line 412 through the defect 134'. As a result, the capacitor 216 will also be read as having a logical "1" value because it is coupled to the column line 412. Similarly, other capacitors coupled to column line 412, when read during testing, will indicate that an initial logical "0" value written thereto is instead now a logical "1" value. Since such erroneous readings all occur along a single column line, testing circuitry described below will be able to identify such a defect 134' occurring between capacitor and a column line.

Figure 4:
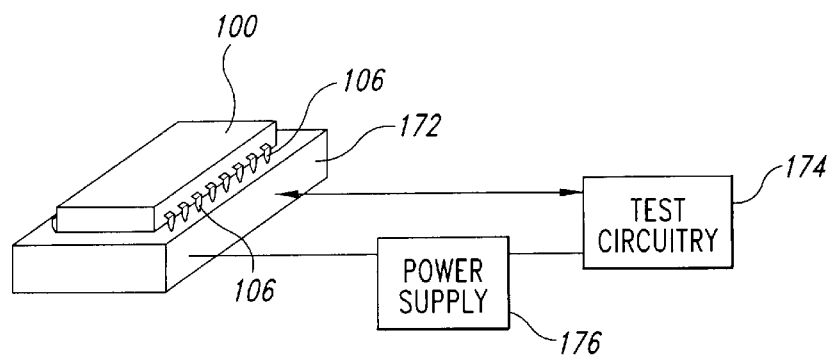
FIG. 4 is a partial isometric, partial block diagram of a testing station for testing the packaged semiconductor memory device of FIG. 1.

Referring to FIG. 4, a testing station 170 for testing the packaged chip 100 of the present invention for the above faults 134 and 134' is shown as having a socket 172 for releasably holding the chip and providing electrical interconnection between the leads 106 and external test circuitry 174. An external power supply 176 coupled to the socket 172 and the test circuitry 174 provides external power to the DVC2 bus 128, through the lead 106' and DVC2 pad 110'.

Since the external power supply 176 can be coupled to the DVC2 bus 128 through the lead 106' and bond wire 114', the test mode circuitry 130 of the present invention is able to provide a sufficiently high voltage equal to approximately a logical "1" value to the ground plate of every capacitor in the memory cell array 118 by means of the DVC2 pad 110. Additionally, the external power supply 176 can also maintain the high voltage value on the DVC2 node for a sufficient period of time to force the defects 134 in capacitors to failures, allowing the logical "1" value to leak through the dielectrics and raise the logical "0" value on the storage plates of the capacitors to a logical "1" value. The external power supply 176 can maintain the high voltage value on the DVC2 node to also force the defects 134 prime between the DVC2 node (i.e., the cell plate) of the capacitors and one or more of the column lines 400, allowing the logical "1" values stored on capacitors along the column line to leak through to the column line and cause it to consistently provide logical "1" values regardless of which row line is activated.

By permitting simultaneous and sustained application of a high voltage or logical "1" value to the DVC node for all of the memory cells in the memory cell array 118, the present invention can rapidly test a large memory circuit 112. Since the external power supply 176 can provide such power to the memory circuit 112 after it has been manufactured into the packaged chip 100, automated pick and place machinery (not shown) can manipulate the chip and insert it into the test socket 172 for testing it to even more rapidly test the memory circuit 112.

Figure 5:
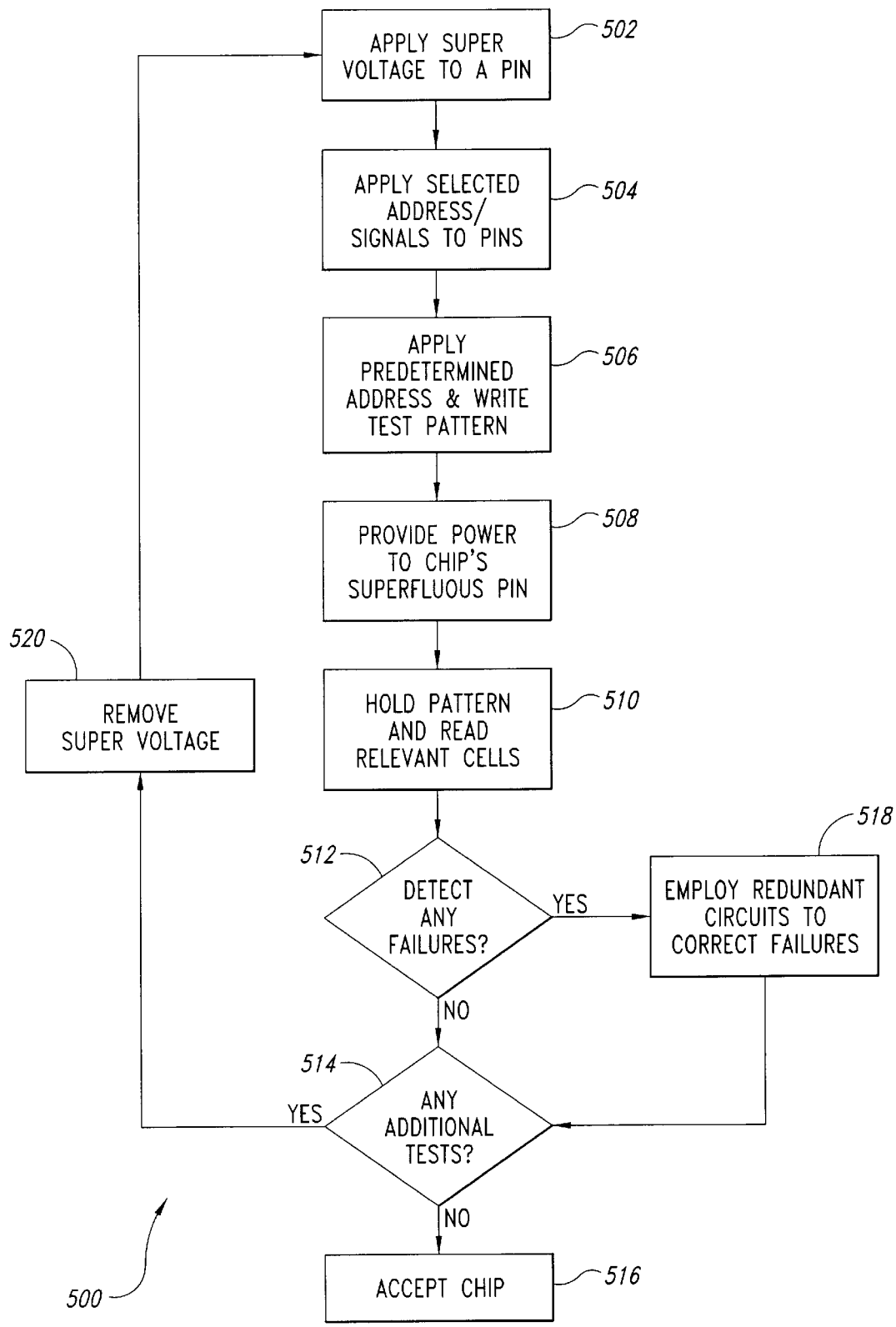
FIG. 5 is a flowchart diagram of the steps performed by the testing station of FIG. 4.

The test circuitry 174 of the test station 170 preferably includes microprocessor or microcontroller circuitry and memory for performing a stress test routine, such as the routine shown in FIG. 5. Referring to FIG. 5, an exemplary routine 500 performed by the test circuitry 174 begins in step 502 by applying a continuous super voltage (such as 10 volts) to a pin of the packaged chip 100 such as the non-connected pin NC. Such a super voltage is one beyond the normal tolerances for the packaged chip 100 and therefore would not normally be applied to the chip by a user under normal conditions.

In step 504, the test circuitry 174 provides a predetermined combination of signals or "test key vector" signal or signals to the pins of the chip 100 to initiate a test node for the chip. For example, the test circuitry 174 in step 504 can force the write enable pin WE to a low value before signals applied to the column address select pin CAS and row address select pin RAS fall to a low value. The address or signals applied to the pins in step 504 are preferably selected to be signals not normally applied to such pins by a user during normal operation of the packaged chip 100, and therefore, a user would not accidentally enter the test mode for the chip. The test key vector signal causes the test mode circuitry 132 to switch transistor 127 on to allow externally applied power to be provided to the DVC2 bus.

In step 506, the test circuitry 174 provides a second predetermined combination of signals or second test key vector signal or signals, which cause the test mode circuitry 130 in the packaged chip 100 to enter into a compression test mode that causes logical "0" values to be written to every memory cell in the memory cell array 118. Thereafter, in step 508, the test circuitry 174 causes the power supply 176 to provide a high voltage power signal to the superfluous pin, such as the address pin A9. The power signal is applied to the DVC2 bus 128 through the voltage boosting circuit 126, DVC2 pad 110', bond wire 114' and lead 106'. In step 508, the test circuitry 174 also preferably turns off the voltage boosting circuit 126 after the test circuitry receives the second test key vector signal. As a result, the high voltage signal is simultaneously applied to the DVC2 node of every memory cell in the memory cell array 118.

After a predetermined period of time to force a failure in any defects 134, in step 510, the test circuitry 174 reads all of the values stored in the memory cells to determine if any of them have a logical "1" value. If in step 512, the test circuitry 174 determines that no cells have a logical "1" value, i.e., that no failures exist, then in step 514, the test circuitry determines whether any additional tests are to be performed on the chip 100. If not, then the chip 100 is deemed acceptable in step 516.

Otherwise, if any of the memory cells along the odd numbered row lines 300 have a logical "1" value, then the test circuitry 174 in step 512 identifies such failures. Thereafter, in step 518, the test circuitry 174 enables redundant circuitry on the packaged chip 100 to compensate for the failure by blowing certain fuses or leads in the chip (if the chip has such redundant circuitry).

If the test circuitry 174 determines in step 514 that additional tests are to be performed on the chip 100, then the test circuitry removes the super voltage from the NC pin in step 520. Steps 502 through 518 are thereafter performed for additional tests until the chip 100 is accepted in step 516. (The routine 500 assumes that all detected failures are correctable in step 518; if they are not, then the chip 100 is discarded.)

The above-described packaged chip 100 invention relies on two criteria. First, the present invention relies on a configuration of the packaged chip 100 whereby all of the leads 106' are electrically coupled by bond wires 114' to pads 110', and that all of the leads are used during certain testing procedures of the chip. For example, the packaged chip 100 can perform additional stress tests, such as the stress test described in the inventor's U.S. patent application entitled "APPARATUS AND METHOD FOR TESTING FOR DEFECTS BETWEEN MEMORY CELLS IN PACKAGED SEMICONDUCTOR MEMORY DEVICES," U.S. Pat. No. 5,657,204. Second, the packaged chip 100 of the present invention relies on the ability of the chip to free up one address pin during compression mode testing of the chip.

Figure 6:
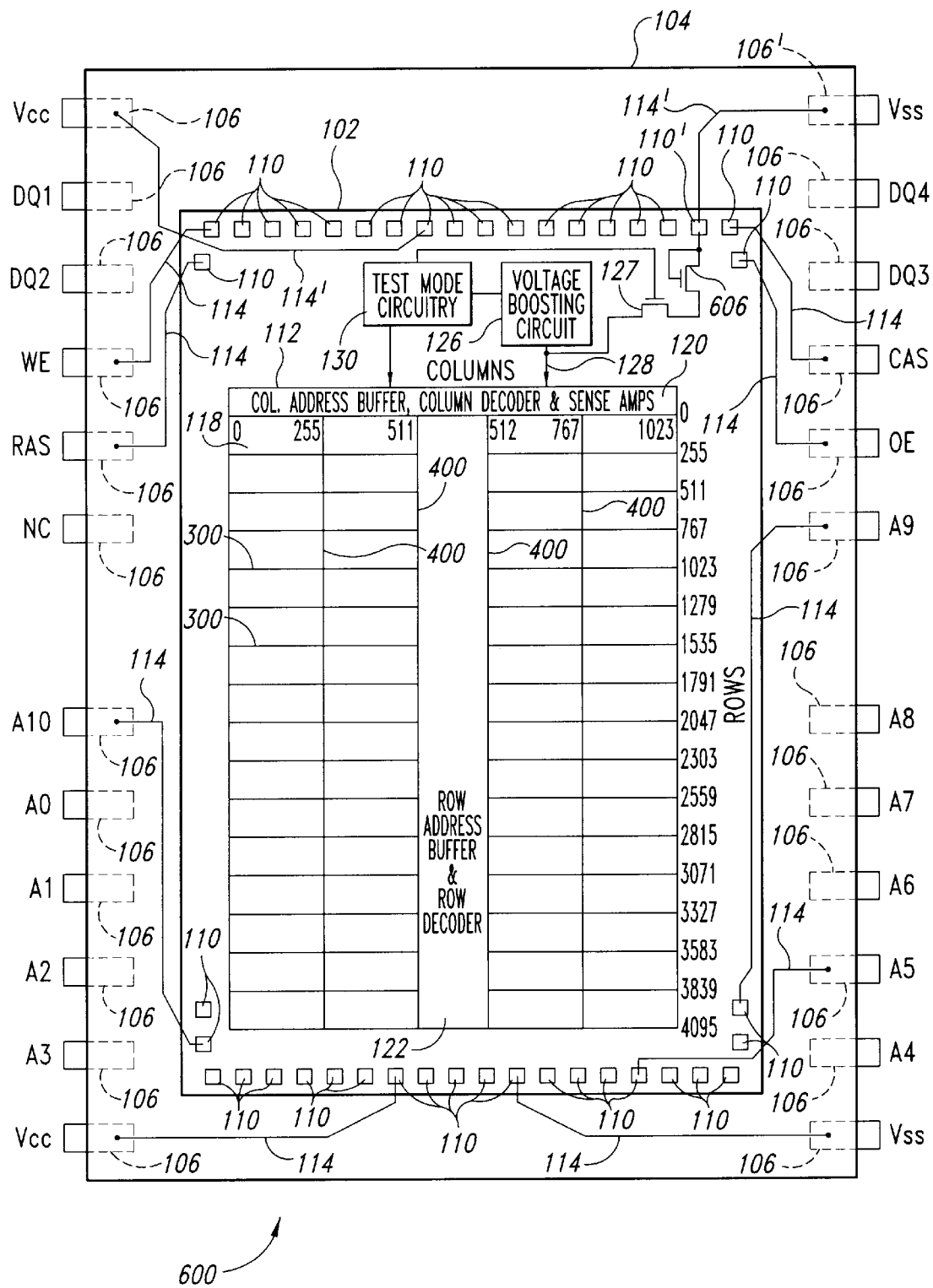
FIG. 6 is a block diagram of an alternative embodiment of the packaged semiconductor memory device of FIG. 1.

Not all chips, however, allow for an address pin to be freed up during testing, therefore, referring to FIG. 6, an alternative embodiment of the present invention is shown as the packaged chip 600. The alternative embodiment of FIG. 6 is similar to the previously described embodiment, and all elements are similarly numbered when of similar construction. Only the significant differences in construction or operation are discussed in detail.

The bond wire 114', rather than being coupled to the free end of the lead 106' of one of the address pins, is instead coupled to the free end of one of the redundant power supply pins Vcc or Vss. As shown in FIG. 6, the bond wire 114' electrically intercouples the DVC2 pad 110' to one of the two Vss pins (forming the lead 106'). As a result, the alternative embodiment of FIG. 6 can permit chips lacking a superfluous address pin during testing to employ the present invention.

The alternative embodiment of FIG. 6 relies on two criteria. First, the alternative embodiment relies on an industry standard for certain memory devices that assigns two leads for the power supply Vcc and Vss (i.e., has redundantly assigned pins). Second, the alternative embodiment relies on efficient bussing of power within the packaged chip 100. For example, the packaged chip 100 need not have both Vss pins coupled to the Vss bus (not shown) of the memory circuit 112 because the Vss bus preferably provides sufficient voltage to the entire memory circuit 112 through one of the Vss pins due to the configuration of the Vss bus in the memory circuit 112. If the Vss bus fails to provide sufficient voltage to the entire memory circuit 112, an alternative configuration can be employed where a bond wire (not shown) couples one of the Vss leads to the two or more Vss pads on the die 102, thereby freeing up one Vss lead. Therefore, while the packaged chip 100 includes two redundant Vss pins because of industry standards, only one such pin is required to supply an external supply voltage to the memory circuit 112.

To protect the voltage boosting circuit 126 and the memory circuit 112 from a negative voltage applied to the Vss lead 106' (and thus to the DVC2 bus 128), one or more protection diodes (shown as a diode connected transistor 606) is connected between the DVC2 pad 110' and the switching transistor 127. Of course, the diode connected transistor 606 can also be employed in the packaged chip 100 of FIG. 1. Additional protection circuitry can be integrated on the die 102 to protect the memory circuit 112 from externally applied signals.

As explained above, by permitting the external power supply 176 to provide a sustained high voltage signal to the DVC2 bus 128 when the memory circuit 112 is incorporated into the packaged chip 100, the memory circuit can be more rapidly tested than when it is unpackaged. The present invention allows for more rapid testing, including burn-in testing of the memory circuit 112. "Burn-in" testing refers to the process of accelerating failures in the memory circuit that occur during the infant mortality phase of the circuit's life to thereby remove inherently weaker circuits. "Infant mortality" refers to those memory circuits 112 that would fail early in their lives due to manufacturing defects. The burn-in process is performed on packaged chips, prior to their shipping to customers. The burn-in process is typically performed at a specified temperature and with specified voltage values for a specified period of time. The burn-in process is an automated process performed on the packaged chips, and therefore, the present invention is ideally suited for allowing the above-described cell-to-cell stress test to be performed on such chips during the burn-in process. As a result, the burn-in process can provide more effective testing of packaged chips before being deemed acceptable devices.

The present invention also allows dielectric defects to be quickly detected and thereby reduce engineering time required to determine the type of failure in a given chip. By adjusting the high voltage applied to the DVC2 node, and monitoring the time it takes for a given storage cell to change from a logical "0" value to a logical "1" value, an engineer can confirm that the dielectric in the storage capacitor for that memory cell has failed. In other words, the time rate of change at which a defective memory cell changes from a logical "0" value to a logical "1" value is dependent on the amount of voltage applied to the DVC2 node. Therefore, by increasing the voltage applied to the DVC2 node and noting that the memory cell changes more quickly to a logical "1" value, an engineer can quickly conclude that the dielectric between the plates of the storage capacitor in the memory cell has failed.

While the detailed description has been expressed, in part, in terms of specific examples, those skilled in the art will appreciate that many other variations could be used to accomplish the purpose of the disclosed invention. For example, those skilled in the art will recognize that the bond wire 114', DVC2 bus 128, and lead 106', and other circuits described herein, must have sufficient capacity to handle the current and voltage required to simultaneously apply a high voltage to the DVC2 node in the memory array 118 under the above-described dielectric stress test. Additionally, the bond wire 114' can be coupled to any redundantly assigned pin, non-connected pin or pin unused by the memory circuit 112 during testing (such as the non-connected pin NC or the address pin A10).

Those skilled in the art will recognize that the present invention is described above for testing DRAM circuits, however, the present invention can be readily adapted to test other packaged semiconductor memories or circuitry. Accordingly, it can be appreciated that equivalent modifications to the above-described embodiments can be made without departing from the spirit and scope of the invention. Therefore, the present invention is limited only by the following claims.

I claim:

1. A semiconductor device capable of receiving external power comprising:

a semiconductor circuit having a plurality of circuit cells addressable by electrically conductive row and column lines, each circuit cell including a capacitor having first and second electrodes, the second electrodes of at least some of the plurality of circuit cells all being electrically coupled to a common node;

a die having the semiconductor circuit and a plurality of input terminals formed thereon, a first input terminal being electrically coupled to the common node, a first set of input terminals being coupled to and providing power signals to the semiconductor circuit, a second set of input terminals being coupled to and providing address signals to access circuit cells in the semiconductor circuit through the row and column lines, and a third set of input terminals being coupled to and providing input signals to and output signals from the semiconductor circuit;

a plurality of electrically conductive leads limited to only an industry standard number of leads for the semiconductor circuit, includes first, second and third sets of leads, each lead has an externally accessible end and a free end, the free ends of the first, second and third sets of leads being electrically coupled to at least some of the input terminals in the first, second and third sets of input terminals, respectively, and at least one of the plurality of leads being a superfluous lead capable of being unused during testing operation of the semiconductor circuit;

an electrical conductor coupled between the first input terminal and the free end of the superfluous lead, the superfluous lead capable of providing external power to the common node through the electrical conductor and the first input terminal during testing of the semiconductor circuit; and an encapsulating material that encapsulates the semiconductor circuit, the die, the free ends of the leads and the electrical conductor as a packaged chip.

2. The semiconductor device of claim 1, further comprising a test mode circuit formed on the die that receives predetermined signals from at least some of the input terminals in one of the second and third sets of input terminals to initiate a test mode for the semiconductor device and allow the common node to receive the external power through the electrical conductor.

3. The semiconductor device of claim 1 wherein the encapsulating material forms the packaged chip as an automatically manipulatable packaged chip.

4. The semiconductor device of claim 1, further comprising a switch coupled between the first input terminal and the common node that selectively allows the external power to be provided to the common node.

5. The semiconductor device of claim 1 wherein the each of the leads is assigned to receive one of the power, address, input and output signals, and wherein the superfluous lead is redundantly assigned during testing of the device to receive the address signal.

6. The semiconductor device of claim 1 wherein the each of the leads is assigned to receive one of the power, address, input and output signals, and wherein the superfluous lead has an unused assignment so as to be unconnected to the semiconductor circuit in the absence of the electrical conductor.

7. The semiconductor device of claim 1 wherein the common node is coupled to the second electrode of the capacitors in all of the plurality of circuit cells, and wherein the external power has a voltage approximately equal to a supply voltage to be supplied to at least one of the input terminals in the first set of input terminals.

8. The semiconductor device of claim 1, further comprising a test mode circuit formed on the die that receives enable signals from the at least some of the input terminals in one of the second and third sets of input terminals to initiate a test mode for the semiconductor device and allows the common node to receive the external power through the electrical conductor to thereby stress test the circuit cells for short circuit failures between the first and second electrodes.

9. The semiconductor device of claim 1, further comprising at least one diode coupled between the first input terminal and the semiconductor circuit.

10. A semiconductor memory device capable of receiving external power comprising:

a semiconductor memory circuit having an array of memory cells addressable by electrically conductive row and column lines, each memory cell including a capacitor having first and second electrodes, the second electrodes of at least some of the plurality of memory cells all being electrically coupled to a common node, each of the capacitors having a dielectric between the first and second electrodes;

a die having the semiconductor memory circuit and a plurality of pads formed thereon, a first pad being electrically coupled to the common node, a first set of pads being coupled to and providing power signals to the semiconductor memory circuit, a second set of pads being coupled to and providing address signals to access memory cells in the semiconductor memory circuit through the row and column lines, and a third set of pads being coupled to and providing input signals to and output signals from the semiconductor memory circuit;

a plurality of electrically conductive leads equal to only an industry standard number of leads for a packaged semiconductor memory device, includes first, second and third sets of leads, each lead has an externally accessible end assigned to receive one of the power, address, input and output signals and a free end, the free ends of the first, second and third sets of leads being electrically coupled to at least some of the pads in the first, second and third sets of pads, respectively, and at least one of the leads being a selected lead capable of being unused during non-standard operation of the array of memory cells;

an electrical conductor coupled between the first pad and the free end of the selected lead, the selected lead capable of providing an external voltage signal to the common node in the array of memory cells through the electrical conductor, and the first pad to thereby permit stress testing of the semiconductor memory circuit including stress testing of the dielectric between the first and second electrodes of the at least some of the plurality of circuit cells; and an encapsulating material that encapsulates the semiconductor memory circuit, the die, the free ends of the leads and the electrical conductor as a packaged chip.

11. The semiconductor memory device of claim 10 wherein the selected lead is redundantly assigned during address compression mode testing of the device to receive the address signal.

12. The semiconductor memory device of claim 10 wherein the selected lead has an unused assignment so as to be unconnected to the semiconductor memory circuit in the absence of the electrical conductor.

13. The semiconductor memory device of claim 10, further comprising a switch coupled between the first pad and the common node that selectively allows the external voltage signal to be provided to the common node.

14. The semiconductor memory device of claim 10, further comprising a test mode circuit formed on the die that receives enable signals from the at least some of the pads in one of the second and third sets of pads to initiate a test mode for the semiconductor memory device and allows the common node to receive the external voltage signal through the electrical conductor to thereby stress test memory cells for short circuit failures between the first and second electrodes.

15. The semiconductor memory device of claim 10, further comprising at least one diode coupled between the first pad and the semiconductor memory circuit.

16. A semiconductor memory device testing apparatus comprising:

a semiconductor memory circuit having a plurality of memory cells addressable by electrically conductive row and column lines, each memory cell including a capacitor having first and second electrodes, the second electrodes of at least some of the plurality of memory cells all being electrically coupled to a common node;

a die having the semiconductor memory circuit and a plurality of pads formed thereon, a first pad being electrically coupled to the common node, a first set of pads being coupled to and providing power signals to the semiconductor memory circuit, a second set of pads being coupled to and providing address signals to access memory cells in the semiconductor memory circuit through the row and column lines, and a third set of pads being coupled to and providing input signals to and output signals from the semiconductor memory circuit;

a plurality of electrically conductive leads not greater than an industry standard number of leads for a packaged semiconductor memory device having the semiconductor memory, includes first, second and third sets of leads, each lead has an externally accessible end assigned to receive one of the power, address, input and output signals and a free end, the free ends of the first, second and third sets of leads being electrically connected to at least some of the pads in the first, second and third sets of pads, respectively, and at least one lead being a redundant or unused lead during testing, as specified under a semiconductor industry standard for the semiconductor memory device;

an electrical conductor coupled between the first pad and the free end of the at least one lead, the at least one lead capable of providing external power to the common node through the electrical conductor and the first pad to thereby permit stress testing of the semiconductor memory circuit;

an encapsulating material that encapsulates the semiconductor memory circuit, the die, the free ends of the leads and the electrical conductor as a packaged chip;

a testing circuit for applying the power, address and input signals to the packaged chip under direction of a test routine and analyzing the output signals therefrom;

an external power source for supplying the external power to the at least one lead; and a socket for releasably holding the packaged chip and electrically coupling the first, second and third sets of leads to the testing circuit and the at least one lead to the external power source during testing of the packaged chip.

* * * * *